United States Patent
Yang et al.

(10) Patent No.: US 10,658,547 B2
(45) Date of Patent: May 19, 2020

(54) LIGHT EMITTING DIODE HAVING PATTERNED MIRROR LAYER

(71) Applicant: EPISTAR CORPORATION, Hsinchu (TW)

(72) Inventors: Cheng-Kuang Yang, Hsinchu (TW);
Hui-Ching Feng, Hsinchu (TW);
Chien-Pin Hsu, Hsinchu (TW);
Kuo-Hui Yu, Hsinchu (TW);
Shyi-Ming Pan, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/051,884

(22) Filed: Aug. 1, 2018

(65) Prior Publication Data

US 2018/0342650 A1    Nov. 29, 2018

Related U.S. Application Data

(63) Continuation of application No. 14/469,593, filed on Aug. 27, 2014, now Pat. No. 10,074,777.

(51) Int. Cl.
| | | |
|---|---|---|
| H01L 33/46 | (2010.01) | |
| H01L 33/62 | (2010.01) | |
| H01L 33/08 | (2010.01) | |
| H01L 33/38 | (2010.01) | |
| H01L 33/40 | (2010.01) | |

(52) U.S. Cl.
CPC ............. *H01L 33/46* (2013.01); *H01L 33/08* (2013.01); *H01L 33/382* (2013.01); *H01L 33/62* (2013.01); *H01L 33/387* (2013.01); *H01L 33/405* (2013.01)

(58) Field of Classification Search
CPC ........ H01L 33/38; H01L 33/62; H01L 33/387
See application file for complete search history.

(56) References Cited

U.S. PATENT DOCUMENTS

| | | |
|---|---|---|
| 6,046,465 A | 4/2000 | Wang et al. |
| 2009/0032908 A1 | 2/2009 | Masui et al. |
| 2009/0267085 A1 | 10/2009 | Lee et al. |
| 2011/0272727 A1 | 11/2011 | Su et al. |
| 2012/0049236 A1 | 3/2012 | Kamiya et al. |
| 2012/0074441 A1 | 3/2012 | Seo et al. |
| 2012/0286307 A1 | 11/2012 | Fang et al. |
| 2013/0026519 A1 | 1/2013 | Huang et al. |
| 2014/0231839 A1 | 8/2014 | Jeon et al. |

FOREIGN PATENT DOCUMENTS

| | | |
|---|---|---|
| CN | 102386295 A | 3/2012 |
| CN | 103119735 A | 5/2013 |
| EP | 2819184 B1 | 1/2018 |

*Primary Examiner* — Kevin Parendo
(74) *Attorney, Agent, or Firm* — Muncy, Geissler, Olds & Lowe, P.C.

(57) ABSTRACT

A light emitting diode (LED) structure including a stacked semiconductor layer, a contact layer and a dielectric reflective layer is provided. The stacked semiconductor layer includes a first type doped layer, a second type doped layer and an active layer disposed between the first type doped layer and the second type doped layer, wherein the first type doped layer, the active layer and the second type doped layer are penetrated by a plurality of recesses. The contact layer is disposed on the second type doped layer. The dielectric reflective layer is disposed on the contact layer and extended into the recesses to connect the contact layer and the first type doped layer with a coverage rate equal to or less than 60% from a top view of the LED structure.

17 Claims, 4 Drawing Sheets

LIGHT EMITTING DIODE HAVING PATTERNED MIRROR LAYER

REFERENCE TO RELATED APPLICATION

This application is a continuation application of U.S. patent application Ser. No. 14/469,593, filed on Aug. 27, 2014, and the content of which is hereby incorporated by reference in its entirety.

BACKGROUND OF THE INVENTION

Field of the Invention

The present invention generally relates to a semiconductor structure. More particularly, the present invention relates to light emitting diode structure.

Description of Related Art

A light emitting diode (LED) has the characteristics of high efficiency, long lifespan, etc. and thus the LED light source has been widely applied. The light-emitting, diode (LED) formed by semiconductor material of the compound of the group III-V elements is a wide band-gap luminous component, which emits the light covering all wavebands of visible light. In recent years, following the progress towards high-chroman and extreme-brightness, LEDs have gained broader applications fields, such as mega-size outdoor display boards and traffic lights, and would even substitute tungsten lamps and mercury lights to become a future lighting source with energy-saving and environmentally friendly advantages.

In a conventional GaN based LED grown on the first substrate, such as sapphire, having an insulating property, since the positive and the negative electrodes of the LED are deposited on, in general the mine side of a first surface, and the positive electrode will screen out the emitted light from the active layer of the LED. Therefore, the packaging for a GaN based LED preferably uses the flip-chip bonding method. Thus, the emitted light will pass through a second surface. Moreover, a metal reflecting layer is formed on the top-most surface of the LED in order to emit most it the emitted light towards the second surface of the LED.

However, the reflectivity of the metal reflecting layer is limited. Meanwhile, attempts to apply a distributed Bragg reflector (DBR) layer to the top-most surface of the LED have been made, wherein the DBR layer is a multi-layer dielectric having alternate layers of dielectric material with a high reflectivity compared to reflectivity of the metal reflecting layer. However, the DBR layer is made of non-conductive material, so the disposition of the DBR layer would have negative impact on electrical performance of the LED. Therefore, there is still a limit in improving the light extraction efficiency in LED packages.

SUMMARY OF THE INVENTION

Accordingly, the present invention is directed to a light emitting diode (LED) structure with favourable light extraction efficiency and electrical performance.

The present invention provides a light emitting diode (LED) structure including a stacked semiconductor layer, a contact layer and a dielectric reflective layer. The stacked semiconductor layer includes a first type doped layer, a second type doped layer and an active layer disposed between the first type doped layer and the second type doped layer, wherein the first type doped layer, the active layer and the second type doped layer are penetrated by a plurality of recesses. The contact layer is disposed on the second type doped layer. The dielectric reflective layer is disposed on the contact layer and extended into the recesses to connect the contact layer and the first type doped layer with a coverage rate equal to or less than 60% from a top view of the LED structure.

According to an embodiment of the present invention, the LED structure further includes an electrode layer disposed on the dielectric reflective layer, wherein the electrode layer comprises a first electrode region and a second electrode region, and the first electrode region and the second electrode region are separated and electrically insulated by a groove.

According to an embodiment of the present invention, the LED structure further includes a plurality of caves with corresponding openings on a top surface of the LED structure, wherein the recesses are disposed on the stacked semiconductor layer.

According to an embodiment of the present invention, the second electrode region of the electrode layer electrically connects to the contact layer through at least some of the caves.

According to an embodiment of the present invention, the LED structure further includes a patterned mirror layer disposed on the contact layer, wherein the patterned mirror layer connects to at least some of the caves and the contact layer, such that the second electrode region of the electrode layer is electrically connected to the contact layer through the corresponding caves and the patterned mirror layer connecting thereto.

According to an embodiment of the present invention, the dielectric reflective layer covers a part of the patterned pin layer, where the patterned mirror layer does not connect to the caves.

According to an embodiment of the present invention, the LED structure further includes a conductive layer disposed between the dielectric reflective layer and the electrode layer, wherein the conductive layer connects to the first type doped layer from at least some of the recesses, and the first electrode region of the electrode layer connects to apart of the conductive layer.

According to an embodiment of the present invention, the LED structure further includes an insulation layer disposed between the second electrode region of the electrode layer and the conductive layer.

According to an embodiment of the present invention, the insulation layer further disposed between the first electrode region of the electrode layer and the conductive layer, where the first electrode region of the electrode layer does not connect to the conductive layer.

According to an embodiment of the present invention, the LED structure further includes a substrate with a surface where the stacked semiconductor layer disposed on, wherein a part of the surface of the substrate is exposed from the stacked semiconductor layer to form an exposed area, and the dielectric reflective layer further covers at least a part of the exposed area of the substrate.

According to an embodiment of the present invention, the dielectric reflective layer comprises a low refractive index layer, and the material of the low refractive index layer is selected from $SiO_2$, $MgF_2$, $CaF_2$ or any combinations thereof.

According to an embodiment of the present invention, the dielectric reflective layer is a Distributed Bragg Reflector (DBR) and further comprises a high refractive index layer, and the material of the high refractive index layer is selected from $TiO_2$, $ZnSe$, $Si_3N_4$, $Nb_2O_5$, $Ta_2O_5$ or any combinations thereof.

According to an embodiment of the present invention, the coverage rate is further equal to or less than 30%.

According to an embodiment of the present invention, at least a part of the caves are stripe-shaped caves, and extensional directions of the stripe-shaped caves are parallel to each other.

According to an embodiment of the present invention, at least a part of the caves are circular-shaped caves and in an array arrangement.

According to an embodiment of the present invention, a material of the contact layer is selected from indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO_2$:Sb, $Ga_2O_3$:Sn, $AgInO_2$:Sn, $In_2O_3$:Zn, $CuAlO_2$, $LaCuOS$, $NiO$, or $CuGaO_2$, $SrCu_2O_2$, Ag, Au, Al, Ti, Pd, graphene or any combinations thereof.

According to an embodiment of the present invention, the second electrode region of the electrode layer connects to the contact layer through the caves.

According to an embodiment of the present invention, the LED structure further includes a conductive layer disposed between the dielectric reflective layer and the electrode layer, wherein the conductive layer is connected to the first type doped layer through at least some of the recesses, and the first electrode region of the electrode layer is connected to a part of the conductive layer.

According, to an embodiment of the present invention, one of the caves where the second electrode region of the electrode layer is electrically connected to the contact layer and one of the recesses where the conductive layer is connected to the first type doped layer are adjacently disposed.

According to an embodiment of the present invention, at least some of the caves where the second electrode region of the electrode layer is electrically connected to the contact layer and at least some of the recesses where the conductive layer is connected to the first type doped layer are alternately disposed.

Based on the abovementioned description, the LED structure of the present invention adopts the dielectric reflective layer as the reflective layer for reflecting the light emitted by the active layer, and the dielectric reflective layer connects to the contact layer and the first type doped layer with a coverage rate equal to or less than 60% from a top view of the LED structure, so as to not only enhance luminous intensity of the LED structure but also keep forward voltage of the LED structure within an acceptable range at the same time. Therefore, the LED structure of the present invention not only enhances the luminous intensity thereof, but also provides favorable electrical performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
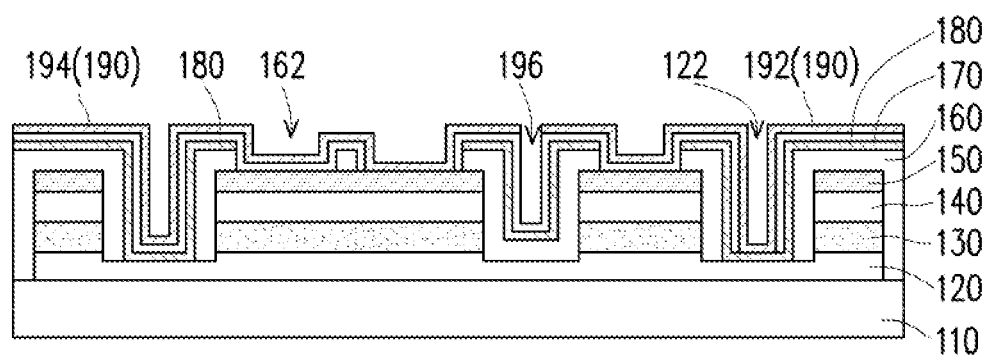
FIG. 1 illustrates a schematic cross-sectional view of a LED structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic cross-sectional view of a LED structure according to an embodiment of the invention. Referring to FIG. 1, in the present embodiment, a GaN based light emitting diode (LED) structure 100 may be a flip-chip type LED structure which includes a stacked semiconductor layer 120, 130, 140, a contact layer 150 and a dielectric reflective layer 160. The stacked semiconductor layer includes a first type doped layer 120, an active layer 130 and a second type doped layer 140. The active layer 130 is disposed between the first type doped layer 120 and the second type doped layer 140. In the present embodiment, the first type doped layer 120, the active layer 130 and the second type doped layer 140 are sequentially stacked on one another, but, of course, the present invention is not limited thereto. The first type doped layer 120, the active layer 130 and the second type doped layer 140 are penetrated by a plurality of recesses 122 for exposing the first type doped layer 120, the active layer 130 and the second type doped layer 140. The contact layer 150 is disposed on the second type doped layer 140. In the present embodiment, the contact layer 150 may be a transparent conductive layer, and the material of the contact layer 150 may be selected from indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO_2$:Sb, $Ga2O_3$:Sn, $AgInO_2$:Sn, $In_2O_3$:Zn, $CuAlO_2$, $LaCuOS$, $NiO$, or $CuGaO_2$, $SrCu_2O_2$, Ag, Au, Al, Ti, Pd, graphene or any combinations thereof.

The dielectric reflective layer 160 is disposed on and connected to the contact w layer 150 and extended into the recesses 122 to connect to the first type doped layer 120 with a coverage rate equal to or less than 60% from a top view of the LED structure 100. Namely, the dielectric reflective layer 160 covers the contact layer 150 and the first type doped layer 120 with a coverage rate equal to or less than 60% from a top view of the LED structure. In the present embodiment, the dielectric reflective layer 160 may include a low refractive index layer, and the material of the low refractive index layer is selected from $SiO_2$, $MgF_2$, $CaF_2$ or any combinations thereof. To be more specific, the dielectric reflective layer 160 is a Distributed Bragg Reflector (DBR) and further includes a high refractive index layer, and the material of the high refractive index layer is selected from $TiO_2$, $ZnSe$, $Si_3N_4$, $Ta_2O_5$ or any combinations thereof. Namely, the dielectric reflective layer 160 is formed from multiple layers of alternating materials with varying refractive index, such that each layer boundary causes a partial reflection of an optical wave. The many reflections combine with constructive interference, such that the dielectric reflective layer 160 acts as a high-quality reflector.

Accordingly, when the coverage rate of the dielectric reflective layer 160 for covering the contact layer 150 and the first type doped layer 120 (hereinafter "the coverage rate of the dielectric reflective layer 160") increases, luminous intensity of the LED structure 100 also increases therewith. However, due to the dielectric characteristic of the dielectric reflective layer 160, when the coverage rate of the dielectric reflective layer 160 increases, a forward voltage which is the voltage required to activate the LED structure 100 also increases. Therefore, the coverage rate of the dielectric reflective layer 160 must be controlled to a designated amount for not only enhancing the luminous intensity of the LED structure 100 but also keeping the forward voltage of the LED structure 100 within an acceptable range.

Figure 2:
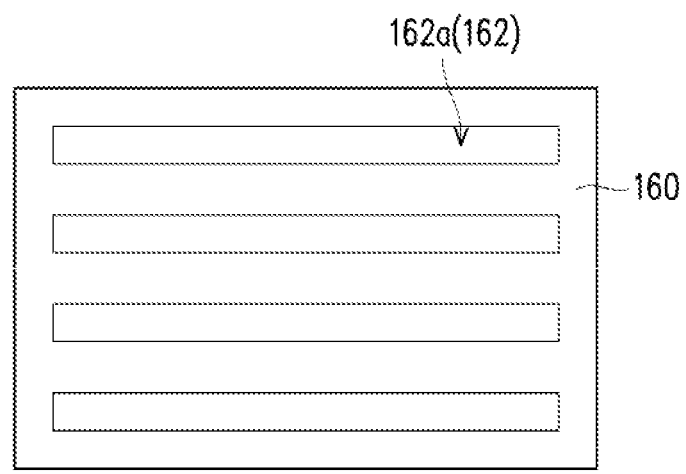
FIG. 2 illustrates a schematic top view of a dielectric reflective layer according to an embodiment of the invention.
Figure 3:
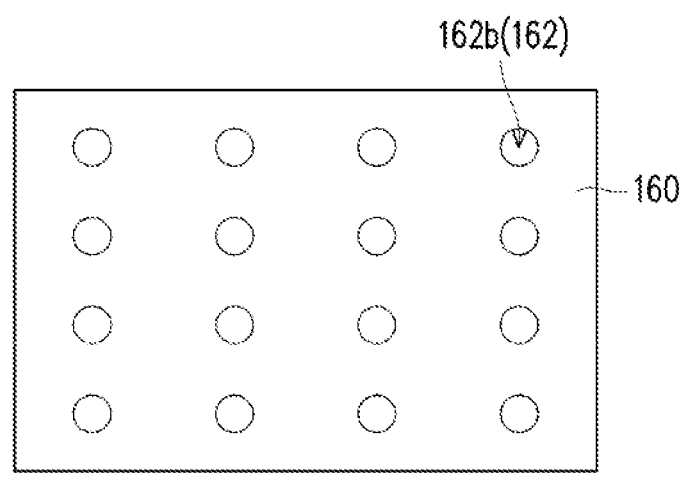
FIG. 3 illustrates a schematic top view of a dielectric reflective layer according to another embodiment of the invention.

FIG. 2 illustrates a schematic top view of a dielectric reflective layer according to an embodiment of the invention. FIG. 3 illustrates a schematic top view of a dielectric reflective layer according to another embodiment of the invention. Referring to FIG. 2 to FIG. 3, for the abovementioned purposes, the dielectric reflective layer 160 may be formed with, for example, a plurality of stripe-shaped caves 162a as shown in FIG. 2, and extensional directions of the stripe-shaped caves 162a may be parallel to each other. Alternatively, the dielectric reflective layer 160 may be formed with, for example, a plurality of circular-shaped caves 162b as shown in FIG. 3 which are in an array arrangement. The stripe-shaped caves 162a and the circular-shaped caves 162b are configured to control the coverage rate of the dielectric reflective layer 160. Namely, the coverage rate of the dielectric reflective layer 160 can be controlled by adjusting the quantity, the sizes or the shapes of the caves 162a, 162b. Certainly, the embodiments shown in FIG. 2 and FIG. 3 are merely for illustration, various modifications and variations can be made to the patterns of the dielectric reflective layer 160 by those skilled in the art, and the present invention is not limited thereto.

Figure 4:
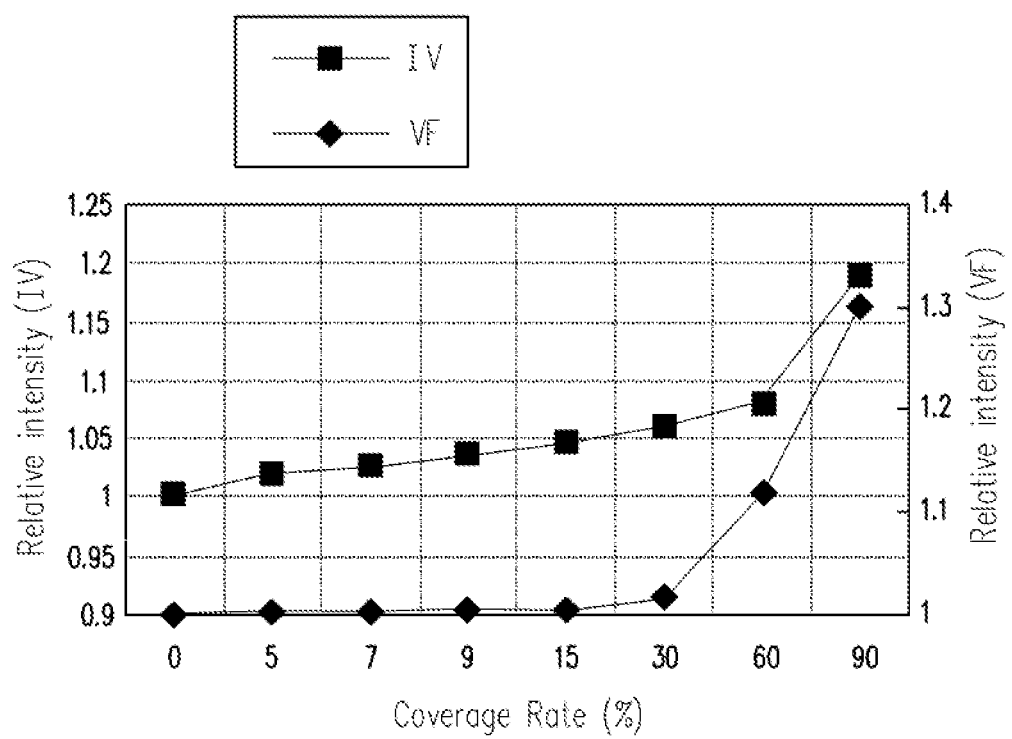
FIG. 4 illustrates curves showing the relationships between a coverage rate of a dielectric reflective layer versus forward voltage (VF) and luminous intensity (IV) according to an embodiment of the invention.

FIG. 4 illustrates curves showing the relationships of a coverage rate of a dielectric reflective layer versus forward voltage (VF) versus and normalized luminous intensity (IV) according to an embodiment of the invention. Two curves are shown in FIG. 4 wherein the curve with the square slot represents the luminous intensity of the LED structure 100 under different coverage rates of the dielectric reflective layer 160, and the curve with the rhomb dot represents the forward voltage of the LED structure 100 under different coverage rates of the dielectric reflective layer 160. It is shown that when the coverage rate of the dielectric reflective layer 160 is equal to or less than 60%, the luminous intensity of the LED structure 100 is enhanced to a relative high value while the forward voltage of the LED structure 100 remains within an acceptable range. Favorably, when the coverage rate of the dielectric reflective layer 160 is equal to or less than 30%, the luminous intensity of the LED structure 100 is enhanced to a favorable value while the forward voltage of the LED structure 100 is kept under a relative low value. Therefore, the coverage rate of the dielectric reflective layer 160 of the LED structure 100 is equal to or less than 60%. To be more specific, the coverage rate of the dielectric reflective layer 160 of the LED structure 100 may be controlled to be equal to or less than 30% and higher than 0%.

In detail, the LED structure 100 as shown in FIG. 1 further includes an electrode layer 190 which is disposed on the dielectric reflective layer 160. The electrode layer 190 includes a first electrode region 192 and a second electrode region 194, wherein the first electrode region 192 and the second electrode region 194 are separated and electrically insulated by a groove 196, such that the LED structure 100 may be electrically connected to, for example, a printed circuit board through the first electrode region 192 and the second electrode region 194. The first electrode region 192 is extended into at least one of the recesses 122 to be electrically connected to the first type doped layer 120 through the at least one of the recesses 122. The LED structure 100 further includes multiple caves 162, such as the stripe-shaped caves 162a and the circular-shaped caves 162b, with corresponding openings on a top surface of the LED structure 100, wherein the caves 162 are located on the stacked semiconductor layer 120, 130, 140 and at least some of the caves are connected to the contact layer 150. The second electrode region 194 is extended into the at least some of the caves 162 to be electrically connected to the contact layer 150 and the second type doped layer 140 through the at least some of the caves 162.

In addition, the LED structure 100 further includes a conductive layer 170 and an insulation layer 180. The conductive layer 170 is disposed between the dielectric reflective layer 160 and the electrode layer 190, and the insulation layer 180 is disposed between the electrode layer 190 and the conductive layer 170. To be more specific, the insulation layer 180 is located between the second electrode region 194 of the electrode layer 190 and the conductive layer 170 to be electrically insulated the second electrode region 194 and the conductive layer 170, while the insulation layer 180 is disposed partially between the first electrode region 192 and the conductive layer 170 where the first electrode region 192 does not connect to the conductive layer 170, and the first electrode region 192 connects to a part of the conductive layer 170 through at least some of the recesses 122. The conductive layer 170 connects to the first type doped layer 120 through the at least some of the recesses 122.

To be more specific, one of the caves 162 where the second electrode region 194 of the electrode layer 190 is electrically connected to the contact layer 150 and one of the recesses 122 where the conductive layer 170 is connected to the first type doped layer 120 may be adjacently disposed. Moreover, at least some of the caves 162 where the second electrode region 194 of the electrode layer 190 is electrically connected to the contact layer 150 and at least some of the recesses 122 where the conductive layer 170 is connected to the first type doped layer 120 are alternately disposed as shown in FIG. 1.

Furthermore, the LED structure 100 further includes a substrate 110 with a surface where the stacked semiconductor layer 120, 130, 140 disposed on. In the present embodiment, the substrate 110 may be, for example, a sapphire substrate. A part of the surface of the substrate 110 is exposed from the stacked semiconductor layer 120, 130, 140 to form an exposed area, and the dielectric reflective layer 160 further covers at least a part of the exposed area of the substrate 110. With the disposition describe above, when the LED structure 100 is connected to, for example, a printed circuit board by flip-chip bonding method, the light emitted by the active layer 230 can be reflected by the dielectric reflective layer 160 to be transmitted through the sapphire substrate for illumination.

Figure 5:
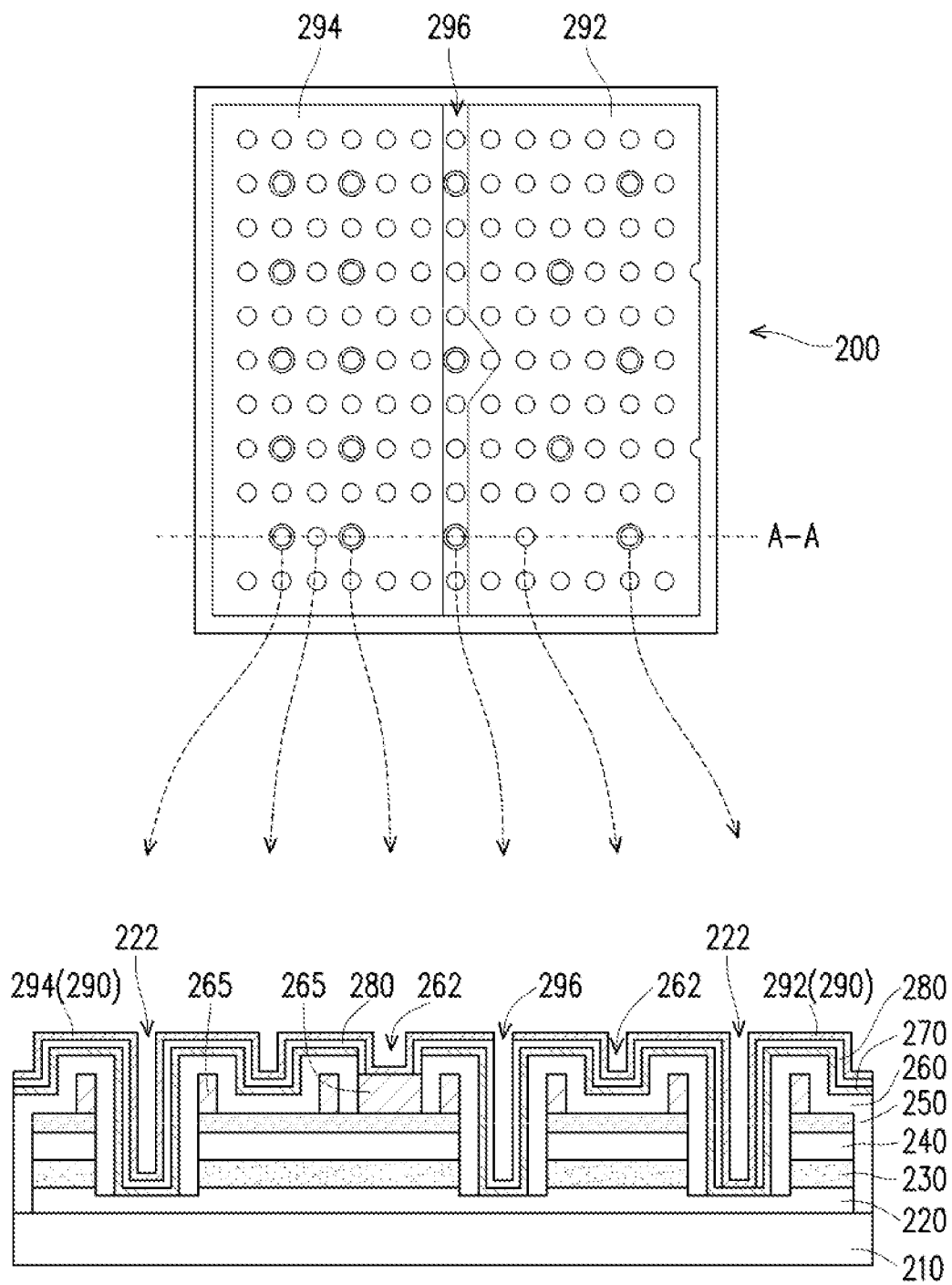
FIG. 5 illustrates a schematic top view of a LED structure and a cross-sectional view thereof taken along line A-A according to an embodiment of the invention.

FIG. 5 illustrates a schematic top view of a LED structure and a cross-sectional view thereof taken along line A-A according to an embodiment of the invention. It is noted that the LED structure 200 shown in FIG. 5 contains many features same as or similar to the LED structure 100 disclosed earlier in FIG. 1. Accordingly, similar reference numbers are used in FIG. 5 and the description to refer to the same or similar parts. For purpose of clarity and simplicity, detail description of same or similar features may be omitted.

The main differences between the LED structure 200 shown in FIG. 5 and the LED structure 100 shown in FIG. 1 are that the LED structure 200 further includes a patterned mirror layer 265 disposed between the contact layer 250 and the dielectric reflective layer 260, wherein the patterned mirror layer 265 connects to at least some of the caves 262 and the contact layer 250, such that the second electrode region 294 of the electrode layer 290 is electrically connected to the contact layer 250 through the corresponding caves 262 and the patterned mirror layer 265 connecting to the corresponding caves 262. The dielectric reflective layer 260 covers at least a part of the patterned mirror layer 265, where the patterned mirror layer 265 does not connect to the caves 262. In other words, the dielectric reflective layer 260 covers most part of the patterned mirror layer 265 except the part where the patterned mirror layer 265 connect to the caves 262, such that the second electrode region 294 can be electrically connected to the patterned mirror layer 265 through the corresponding caves 262.

In general, the dielectric reflective layer 260 connects to the contact layer 250 and the first type doped layer 220 with a coverage rate equal to or less than 60% from a top view of the LED structure 100. In the present embodiment, the dielectric reflective layer 260 connects to the contact layer 250 and the first type doped layer 220 with a coverage rate equal to or less than 30% from a top view of the LED structure 200. The material of the patterned mirror layer 265 can be conductive material having an element selected from silver (Ag), aluminum (Al), gold (Au), rhodium (Rh), palladium (Pd), copper (Cu), chromium (Cr), titanium (Ti), platinum (Pt), or any combinations thereof. As such, the patterned mirror layer 265 connected to the contact layer 250 and the second electrode region 294 may be configured to enhance the electrical performance of the LED structure 200 and also help reflecting the light emitted by the active layer 230. Moreover, the patterned mirror layer 265 may also be configured to control the coverage rate of the dielectric reflective layer 260. Namely, the coverage rate of the dielectric reflective layer 260 may be controlled by the distribution of the patterned mirror layer 265.

It can be seen from the top view of the LED structure 200 in FIG. 5 that the electrode layer 290 includes a first electrode region 292 and a second electrode region 294, wherein the first electrode region 292 an the second electrode region 294 are separated and electrically insulated by a groove 296, such that the LED structure 200 may be electrically connected to for example, a printed circuit board through the first electrode region 292 and the second electrode region 294 by flip-chip bonding technique.

In addition, one of the caves 262 where the second electrode region 294 is electrically connected to the contact layer 250 and one of the recesses 222 where the conductive layer 270 is connected to the first type doped layer 220 are, for example, adjacently disposed. Moreover, at least some of the caves 262 where the second electrode region 294 is electrically connected to the contact layer 250 and at least some of the recesses 222 where the conductive layer 270 is connected to the first type doped layer 220 may be alternately disposed.

In sum, the LED structure of the present invention adopts the dielectric reflective layer as the reflective layer for reflecting the light emitted by the active layer, and the dielectric reflective layer connects to the contact layer and the first type doped layer with a coverage rate equal to or less than 60% from a top view of the LED structure, so as to not only enhance luminous intensity of the LED structure but also keep forward voltage of the LED structure within an acceptable range at the same time.

In addition, a patterned mirror layer may be further disposed between the contact layer and the dielectric reflective layer for connecting the contact layer and the second electrode region. The dielectric reflective layer covers at least a part of the patterned mirror layer. The material of the patterned mirror layer can be conductive material, such that the patterned mirror layer may be configured to enhance the electrical performance of the LED structure and also help reflecting the light emitted by the active layer. Therefore, the LED structure of the present invention not only enhances the luminous intensity thereof, but also provides favorable electrical performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) structure, comprising:
   a stacked semiconductor layer comprising:
      a first type doped layer;
      a second type doped layer; and
      an active layer disposed between the first type doped layer and the second type doped layer;
   a recess penetrating the second type doped layer and the active layer, wherein a bottom of the recess exposes the first type doped layer;
   a contact layer disposed on the second type doped layer;
   a dielectric reflective layer covering the contact layer and the first type doped layer by extending into the recess, the dielectric reflective layer comprising a cave formed on the second type doped layer and on the contact layer;
   a patterned mirror layer formed on the contact layer, one part of the patterned mirror layer connecting to the cave of the dielectric reflective layer and another one part of the patterned mirror layer being covered by the dielectric reflective layer, wherein in a cross-sectional view of the light emitting diode (LED) structure the one part of the patterned mirror layer comprises a width larger than that of the another one part of the patterned mirror layer;
   a conductive layer contacting the first doped layer and electrically connected to the first doped layer through the recess; and
   an electrode layer disposed on the dielectric reflective layer, wherein the electrode layer comprises a first electrode region and a second electrode region, wherein the first electrode region comprises a first top surface comprising a first concave portion corresponding to the recess, and wherein the second electrode region comprises a second top surface comprising a second concave portion corresponding to the cave.

2. The LED structure as claimed in claim 1, wherein the first electrode region and the second electrode region are separated by a groove.

3. The LED structure as claimed in claim 2, wherein the second electrode region of the electrode layer is electrically connected to the contact layer through the cave, and the cave comprises a circular shape in a top view of the LED structure.

4. The LED structure as claimed in claim 1, wherein the dielectric reflective layer covers a total top surface of the another one part of the patterned mirror layer.

5. The LED structure as claimed in claim 1, wherein the first electrode region is extended into the recess and the second electrode region is extended into the cave.

6. The LED structure as claimed in claim 1, further comprising a substrate with a surface where the stacked semiconductor layer disposed on, wherein a part of the surface of the substrate is exposed from the stacked semiconductor layer to form an exposed area, and the dielectric reflective layer further covers at least a part of the exposed area of the substrate.

7. The LED structure as claimed in claim 6, wherein a portion of the first electrode region or the second electrode region is formed on the exposed area of the substrate.

8. The LED structure as claimed in claim 1, wherein a material of the contact layer is selected from indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO2:Sb$, $Ga_2O_3:Sn$, $AgInO_2:Sn$, $In_2O_3:Zn$, $CuAlO_2$, LaCuOS, NiO, $CuGaO_2$, $SrCu_2O_2$, Ag, Au, Al, Ti, Pd, graphene or any combinations thereof.

9. The LED structure as claimed in claim 1, wherein the dielectric reflective layer comprises multiple layers of alternating materials with varying refractive index.

10. The LED structure as claimed in claim 9, wherein the dielectric reflective layer is a Distributed Bragg Reflector (DBR), and
wherein the dielectric reflective layer comprises a high refractive index material selected from a group consisting of $TiO_2$, ZnSe, $Si_3N_4$, $Nb_2O_5$, and $Ta_2O_5$, and a low refractive index material selected from a group consisting of $SiO_2$, $MgF_2$, and $CaF_2$.

11. A light emitting diode (LED) structure, comprising:
a substrate comprising a surface;
a stacked semiconductor layer formed on the surface of the substrate, comprising:
a first type doped layer;
a second type doped layer; and
an active layer disposed between the first type doped layer and the second type doped layer, wherein a part of the surface of the substrate is exposed from the stacked semiconductor layer to form an exposed area;
a recess penetrating the second type doped layer and the active layer, wherein a bottom of the recess exposes the first type doped layer;
a contact layer disposed on the second type doped layer;
a dielectric reflective layer covering the contact layer and the first type doped layer by extending into the recess the dielectric reflective layer comprising a cave formed on the second type doped layer and on the contact layer;
a patterned mirror layer formed on the contact layer, one part of the patterned mirror layer connecting to the cave of the dielectric reflective layer and another one part of the patterned mirror layer being covered by the dielectric reflective layer, wherein in a cross-sectional view of the light emitting diode (LED) structure, the one part of the patterned mirror layer comprises a width larger than that of the another one part of the patterned mirror layer;
a conductive layer contacting the first doped layer and electrically connected to the first doped layer through the recess; and
an electrode layer disposed on the dielectric reflective layer, wherein the electrode layer comprises a first electrode region and a second electrode region, wherein the first electrode region comprises a first top surface comprising a first concave portion corresponding to the recess, wherein the second electrode region comprises a second top surface comprising a second concave portion corresponding to the cave, and wherein a portion of the first electrode region or the second electrode region is formed on the exposed area of the substrate.

12. The LED structure as claimed in claim 11, wherein the dielectric reflective layer covers the exposed area of the substrate.

13. The LED structure as claimed in claim 11, wherein the second electrode region of the electrode layer is electrically connected to the contact layer through the cave, and the cave comprises a circular shape in a top view of the LED structure.

14. The LED structure as claimed in claim 11, wherein the dielectric reflective layer covers a total top surface of the another one part of the patterned mirror layer.

15. The LED structure as claimed in claim 11, wherein the first electrode region is extended into the recess and the second electrode region is extended into the cave.

16. The LED structure as claimed in claim 11, wherein a material of the contact layer is selected from indium tin oxide (ITO), cerium tin oxide (CTO), antimony tin oxide (ATO), aluminum zinc oxide (AZO) indium zinc oxide (IZO), zinc oxide (ZnO), cadmium tin oxide, $ZnGa_2O_4$, $SnO2:Sb$, $Ga_2O_3:Sn$, $AgInO_2:Sn$, $In_2O_3:Zn$, $CuAlO_2$, LaCuOS, NiO, $CuGaO_2$, $SrCu_2O_2$, Ag, Au, Al, Ti, Pd, graphene or any combinations thereof.

17. The LED structure as claimed in claim 11, wherein the dielectric reflective layer is a Distributed Bragg Reflector (DBR), and
wherein the dielectric reflective layer comprises a high refractive index material selected from a group consisting of $TiO_2$, ZnSe, $Si_3N_4$, $Nb_2O_5$, and $Ta_2O_5$, and a low refractive index material selected from a group consisting of $SiO_2$, $MgF_2$, and $CaF_2$.

* * * * *